United States Patent
Li et al.

(10) Patent No.: US 11,332,145 B2
(45) Date of Patent: May 17, 2022

(54) APPARATUS, SYSTEM AND SOFTWARE FOR BRIGHTNESS CONTROL OF VEHICLE DISPLAY BASED ON INFRARED CAMERA

(71) Applicant: Guangzhou Xiaopeng Autopilot Technology Co., Ltd, Guangzhou (CN)

(72) Inventors: Zhe Li, Mountain View, CA (US); Cheng Lu, Mountain View, CA (US); Tianpeng Feng, Mountain View, CA (US); Yandong Guo, Mountain View, CA (US); Jun Ma, Mountain View, CA (US)

(73) Assignee: GUANGZHOU XIAOPENG AUTOPILOT TECHNOLOGY CO., LTD., Guangdong (CN)

( * ) Notice: Subject to any disclaimer, the term of this patent is extended or adjusted under 35 U.S.C. 154(b) by 419 days.

(21) Appl. No.: 16/439,802

(22) Filed: Jun. 13, 2019

(65) Prior Publication Data
US 2020/0391749 A1 Dec. 17, 2020

(51) Int. Cl.
*B60W 40/02* (2006.01)
*H01L 27/146* (2006.01)
*F21V 5/00* (2018.01)

(52) U.S. Cl.
CPC .............. *B60W 40/02* (2013.01); *F21V 5/007* (2013.01); *H01L 27/14649* (2013.01); *B60W 2420/40* (2013.01)

(58) Field of Classification Search
CPC .. G09G 5/10; G09G 2380/10; G09G 2380/16; G09G 3/00; G09G 3/04; G09G 3/16; G09G 3/06; G09G 3/20; G09G 3/22; G09G 3/32; G09G 3/3208; G09G 3/3225; G09G 3/3233; G09G 3/34; G09G 3/3406; G09G 3/36; G09G 3/3607; G09G 2320/0285; G09G 2320/0626; G09G 2360/144; B60Q 1/1423; G01J 1/00; G01J 1/04; G01R 17/00; G01R 17/02; G01R 15/00; G01R 15/22; B60W 2540/00; B60W 40/00; B60W 40/08; B60W 40/02; B60W 2420/40; H01L 27/146; H01L 27/14609;
(Continued)

(56) References Cited

U.S. PATENT DOCUMENTS 8,779,345 B2 * 7/2014 Mahowald ................ G01J 1/04
250/214 AL
2012/0154355 A1 * 6/2012 Kawai ...................... H04N 5/58
345/207

* cited by examiner

*Primary Examiner* — Anthony R Jimenez
(74) *Attorney, Agent, or Firm* — Locke Lord LLP; Tim Tingkang Xia, Esq.

(57) ABSTRACT

Apparatus for controlling a brightness of a display of a vehicle includes: an infrared illuminator, configured to emit infrared light in the vehicle; a near infrared (NIR) light sensing unit, configured to capture reflected infrared light; an image data processing unit, configured to analyze the reflected infrared light to generate a feedback; an imaging control unit, configured to adjust, in response to the feedback, one or more of a plurality of properties of the NIR light sensing unit, so that readouts of the NIR light sensing unit are within a first range, wherein the image data processing unit generates a calculated NIR intensity readout under the adjusted properties; a reconstruction unit, configured to reconstruct a human perceived brightness based on the calculated NIR intensity readout; and the display, configured to adjust the brightness. The NIR light sensing unit is a unit of a driver monitoring system (DMS).

22 Claims, 6 Drawing Sheets

(58) Field of Classification Search
CPC ........... H01L 27/1465; H01L 27/14643; H01L 27/14649; H01L 27/3269; F21V 5/007
USPC .................................. 345/207, 690; 701/85
See application file for complete search history.

| IR intensity readouts (DN) | 10 | 20 | 30 | ......... | 250 |
|---|---|---|---|---|---|
| Human perceived brightness (Lux) | 20 | 35 | 66 | ......... | 700 |

FIG. 5

APPARATUS, SYSTEM AND SOFTWARE FOR BRIGHTNESS CONTROL OF VEHICLE DISPLAY BASED ON INFRARED CAMERA

FIELD OF THE INVENTION

This present invention relates generally to a brightness control unit of vehicle display, and specifically to an ambient light sensing system which requires a Near-Infrared (NIR) camera, computing platform and its algorithms.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions.

Electronic displays, including LCD, LED, or OLED, connected to numerous types of computers or intelligent systems have be pervasively used in many industrial and commercial products. All these types of displays serve as critical human-machine interfaces on different computing platforms. Traditionally, the display device offers only uni-directional interaction with user, namely displaying visual information to the user but relying on other input devices, such as keyboard or writing pad, to command the computing system. With emerging touch-screen technology, this interaction has evolved to be bi-directional, namely allowing user to send command to computing devices. This trend was dramatically accelerated by smartphone development in the last decade, plus rapidly growing public demands on faster internet and bigger screen.

Spurred by similar market demand, most automotive manufactures started to integrate big-size touch screen display into their vehicles a few years ago, symbolizing by those electrical vehicle companies that invested heavily on autonomous driving and artificial intelligence technology. The larger and larger in-dash display creates more possibilities in terms of build-in functionalities. These functionalities are mostly related to driving assistant system (back-up camera, navigation, vehicle status monitoring, etc.) or in-cabin entertainments (music, radio, video, blue-tooth, etc.).

While an in-dash big display offers a concise and technological look, plus unprecedented interactive convenience, to driver, it also raises new safety concern and sometimes causes unpleasant driving experience. There are many factors that potentially impact the user experience of in-cabin display, such as color accuracy, image quality, brightness and frame rate. Among all these factors, brightness is one of the most critical variables that can decisively shape driver's opinion on the in-cabin display, while other influence is limited or even marginal. This is because human vision system relies overwhelmingly more on brightness, or luminance, to distinguish a given object compared with color information. An illustrative example is that people can easily understand an image without any color (monochrome photography), however an image without correct brightness is meaningless to human viewer. With that said, it is harmful to set the brightness of in-cabin displays either too high or too low. A display at very dark brightness level is naturally not able to provide driver with clear information, especially in a very strong ambient light environment. Dark display usually forces driver to either get close to the screen or increase brightness, both of which negatively impact the user experience. On the other hand, a display that is too bright, especially in a very dark ambient light environment, also causes unpleasant user experience, and potentially distracts driver from careful driving which raise severe safety concern. Plus, long-time exposure to high brightness light source is also harmful to human eyes.

To address this problem, manufactures started to provide tunable displays that their brightness is fully controllable by the users. The flexibility allows each user to adjust the display based on personal visual preference, partially meeting the expectation because it still requires human intervention. The automatic brightness control was not possible until the application of ambient light sensor. The ambient light sensor is a light sensing unit whose frequency response is very close to behavior of human perception. FIG. 1 shows schematically the brightness sensitivity function of human eye. Human vision system can see light with wavelength ranging from 400 nm to 700 nm. Perceptually, we call light with a wavelength close to 400 nm as blue light and light with a wavelength close to 700 nm as red light. However, light at different wavelength doesn't contribute equally to perceived brightness, which means that two light sources bearing the same energy but at different wavelengths are not seen as equally bright to human. For example, given a green light source and a red light source both emitting the same amount of energy, human vision system always "thinks" the green light source is brighter. Similarly, the ambient light sensor is designed to match our perceptual frequency response, then sends this measurement to the target display so that its brightness can be adaptively optimized.

Although using the ambient light sensor is a favorable approach to adaptive brightness control for in-dash display, a few of its drawbacks prevent it from universal deployment. First, integrating an ambient light sensor into the in-dash display requires unique product design to fit each sensor. Unfortunately, the cost associated with this re-design is typically very high. Secondly, the sensor needs to be exposed to ambient environment for accurate measurement, consequently making it fully visible to user. This visibility typically breaks the integrity of display panel, which leads to poor product design and inferior appearance.

Therefore, a heretofore unaddressed need exists in the art to address the aforementioned deficiencies and inadequacies.

SUMMARY OF THE INVENTION

The present invention relates to apparatus and method for visualizing potential behaviors of surrounding objects of a vehicle.

In one aspect of the invention, an apparatus for controlling a brightness of a display of a vehicle includes: an infrared (IR) illuminator, configured to emit infrared light in the vehicle; a near infrared (NIR) light sensing unit, configured to capture reflected infrared light; an image data processing unit, configured to analyze the reflected infrared light captured by the NIR light sensing unit to generate a feedback; an imaging control unit, configured to adjust, in response to the feedback, one or more of a plurality of properties of the NIR light sensing unit, so that readouts of the NIR light sensing unit are within a first range, wherein the image data processing unit generates a calculated NIR intensity readout under the adjusted plurality of properties of the NIR light sensing unit; a reconstruction unit, configured to reconstruct a human perceived brightness based on the calculated NIR intensity readout; and the display, configured to adjust the brightness based on the human perceived brightness.

In one embodiment, the NIR light sensing unit is a unit of a driver monitoring system (DMS).

In one embodiment, the NIR light sensing unit is a focal plane array (FPA) NIR light sensing unit.

In one embodiment, the NIR light sensing unit is covered with a color filter, the color filter having a passing band between 825 nm and 875 nm.

In one embodiment, the plurality of properties of the NIR light sensing unit are one or more of: an analog gain; a digital gain; and an exposure time.

In one embodiment, the first range is associated with a dynamic range of the NIR light sensing unit.

In one embodiment, the image data processing unit takes an average over one or more regions of interest (ROI) in the vehicle to calculate the calculated NIR intensity readout.

In one embodiment, the reconstruction unit correlates the calculated NIR intensity readout with the human perceived brightness based on a first set of prior psychophysical experiments.

In one embodiment, the display correlates the human perceived brightness with the brightness of the display based on a second set of prior psychophysical experiments.

In one embodiment, the display has a brightness change rate within a second range.

In another aspect of the invention, a method for controlling a brightness of a display of a vehicle includes: emitting infrared (IR) light in the vehicle; capturing, by a near infrared (NIR) light sensing unit, reflected infrared light; analyzing, by an image data processing unit, the reflected infrared light captured by the NIR light sensing unit to generate a feedback; adjusting, in response to the feedback, one or more of a plurality of properties of the NIR light sensing unit, so that readouts of the NIR light sensing unit are within a first range; generating, by the image data processing unit, a calculated NIR intensity readout under the adjusted plurality of properties of the NIR light sensing unit; reconstructing a human perceived brightness based on the calculated NIR intensity readout; and adjusting the brightness of the display based on the human perceived brightness.

In one embodiment, the NIR light sensing unit is a unit of a driver monitoring system (DMS).

In one embodiment, the NIR light sensing unit is a focal plane array (FPA) NIR light sensing unit.

In one embodiment, the NIR light sensing unit is covered with a color filter, the color filter having a passing band between 825 nm and 875 nm.

In one embodiment, the plurality of properties of the NIR light sensing unit are one or more of: an analog gain; a digital gain; and an exposure time.

In one embodiment, the first range is associated with a dynamic range of the NIR light sensing unit.

In one embodiment, the method further includes: taking an average, by the image data processing unit, over one or more regions of interest (ROI) in the vehicle to calculate the calculated NIR intensity readout.

In one embodiment, the method further includes: correlating the calculated NIR intensity readout with the human perceived brightness based on a first set of prior psychophysical experiments.

In one embodiment, the method further includes: correlating the human perceived brightness with the brightness of the display based on a second set of prior psychophysical experiments.

In one embodiment, the display has a brightness change rate within a second range.

In yet another aspect, the invention relates to a non-transitory tangible computer-readable medium storing instructions which, when executed by one or more processors, cause a method for controlling a brightness of a display of a vehicle includes: emitting infrared (IR) light in the vehicle; capturing, by a near infrared (NIR) light sensing unit, reflected infrared light; analyzing, by an image data processing unit, the reflected infrared light captured by the NIR light sensing unit to generate a feedback; adjusting, in response to the feedback, one or more of a plurality of properties of the NIR light sensing unit, so that readouts of the NIR light sensing unit are within a first range; generating, by the image data processing unit, a calculated NIR intensity readout under the adjusted plurality of properties of the NIR light sensing unit; reconstructing a human perceived brightness based on the calculated NIR intensity readout; and adjusting the brightness of the display based on the human perceived brightness.

In one embodiment, the NIR light sensing unit is a unit of a driver monitoring system (DMS).

These and other aspects of the present invention will become apparent from the following description of the preferred embodiments, taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

FIG. 5 shows schematically a lookup table between calculated NIR intensity readouts and human perceived brightness.

DETAILED DESCRIPTION OF THE INVENTION

Figure 1:
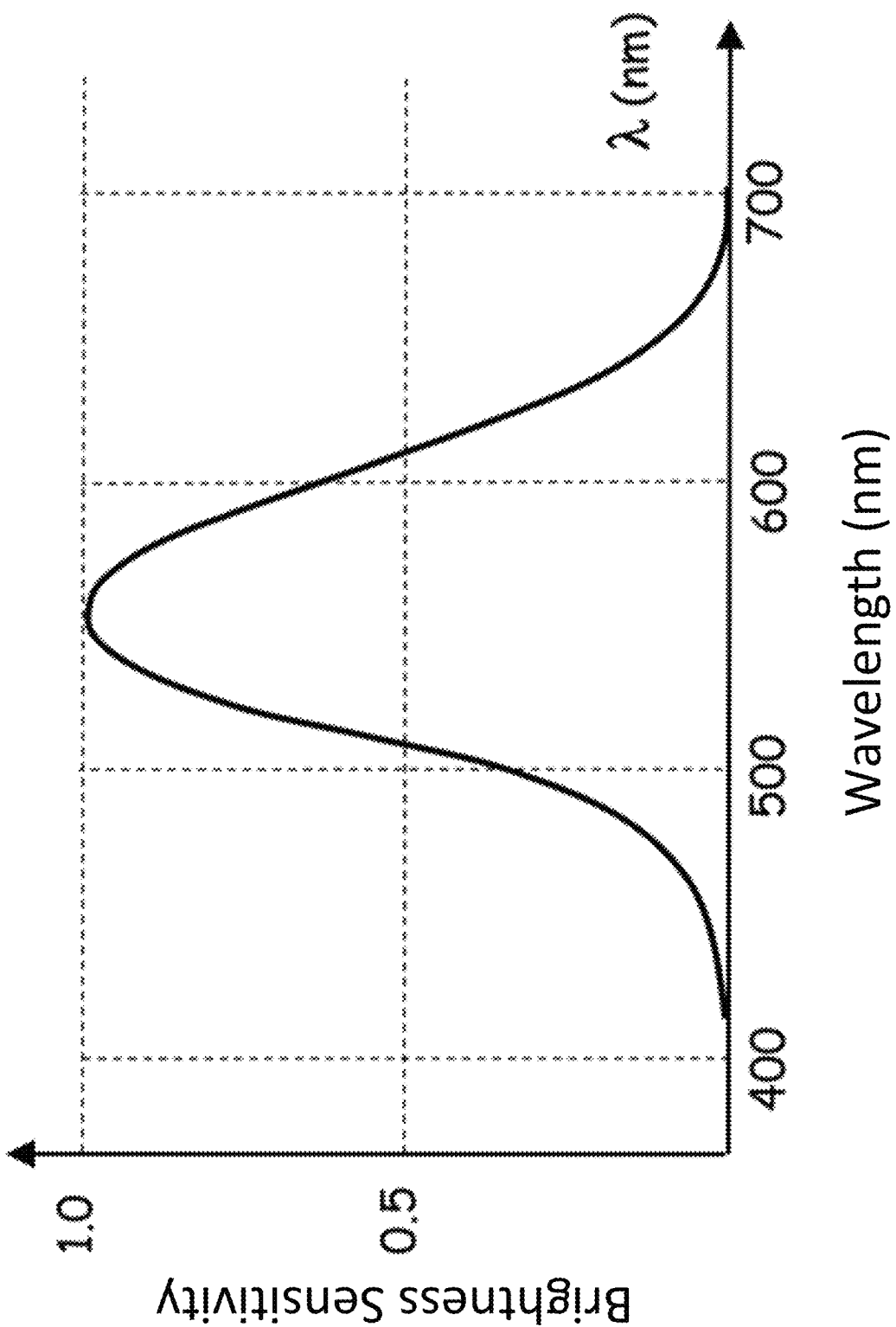
FIG. 1 shows schematically the brightness sensitivity function of human eye.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this invention, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

As used herein, the phrase at least one of A, B, and C should be construed to mean a logical (A or B or C), using a non-exclusive logical OR. As used herein, the term "and/or" includes any and all combinations of one or more of the associated listed items.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The terms chip or computer chip, as used herein, generally refers to a hardware electronic component, and may refer to or include a small electronic circuit unit, also known as an integrated circuit (IC), or a combination of electronic circuits or ICs.

As used herein, the term microcontroller unit or its acronym MCU generally refers to a small computer on a single IC chip that can execute programs for controlling other devices or machines. A microcontroller unit contains one or more CPUs (processor cores) along with memory and programmable input/output (I/O) peripherals, and is usually designed for embedded applications.

The term interface, as used herein, generally refers to a communication tool or means at a point of interaction between components for performing wired or wireless data communication between the components. Generally, an interface may be applicable at the level of both hardware and software, and may be uni-directional or bi-directional interface. Examples of physical hardware interface may include electrical connectors, buses, ports, cables, terminals, and other I/O devices or components. The components in communication with the interface may be, for example, multiple components or peripheral devices of a computer system.

The term code, as used herein, may include software, firmware, and/or microcode, and may refer to programs, routines, functions, classes, and/or objects. Some or all code from multiple modules may be executed using a single (shared) processor. In addition, some or all code from multiple modules may be stored by a single (shared) memory. Further, some or all code from a single module may be executed using a group of processors. Moreover, some or all code from a single module may be stored using a group of memories.

The apparatuses and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system. By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Figure 2:
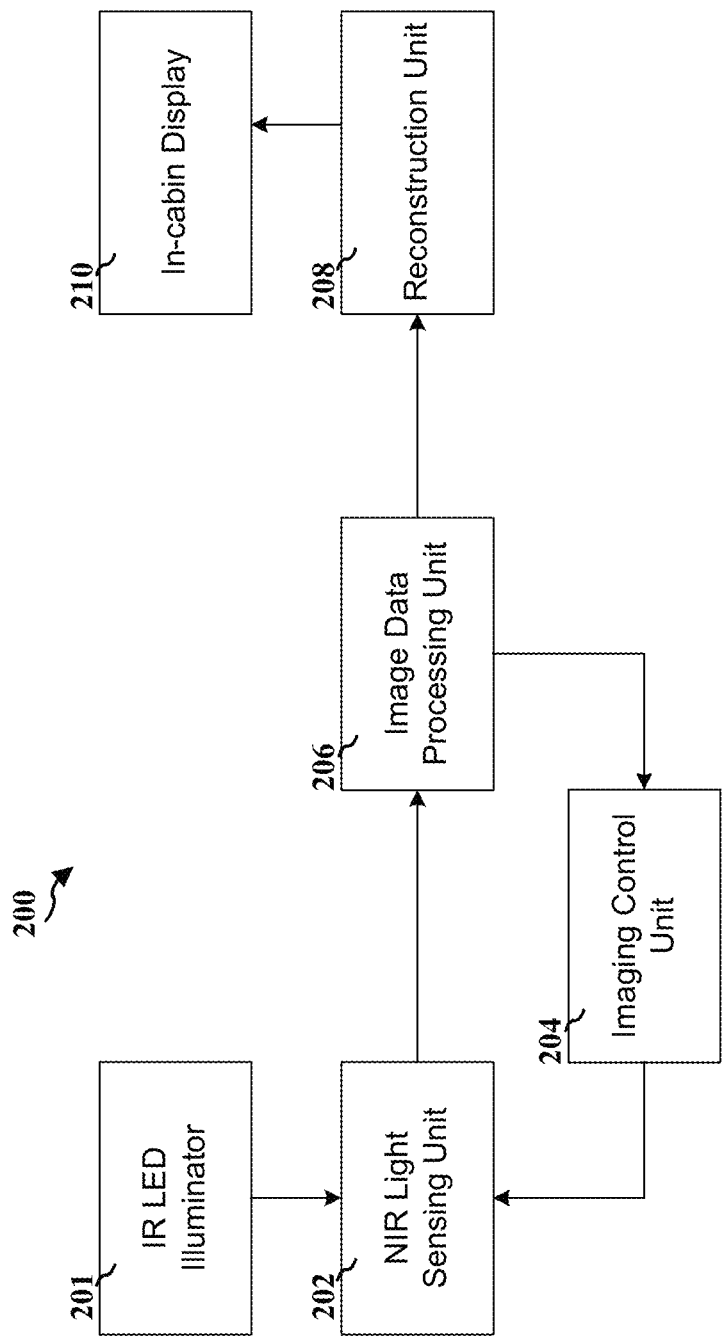
FIG. 2 shows schematically a system for brightness control of vehicle display based on infrared camera according to one embodiment of the invention.

FIG. 2 shows schematically a system for brightness control of vehicle display based on infrared camera according to one embodiment of the invention. The system 200 includes an infrared light-emitting diode (LED) illuminator 201, a near-infrared (NIR) light sensing unit 202, an imaging control unit 204, an image data processing unit 206, a reconstruction unit 208 and an in-cabin display 210.

The NIR light sensing unit 202 is a driver monitoring system (DMS) camera. Thanks to the fast development of artificial intelligence, more vehicles are equipped with the driver monitoring system (DMS). DMS is widely used in many applications such as fatigue detection, driver ID verification and in-cabin abnormal action warning. The DMS includes a DMS camera, which is used as a light sensing unit to capture images in the vehicle cabin. The most important images captured are drivers' faces. The captured images are subsequently sent to DMS computing platform which runs a group of intelligent algorithms. Finally, by analyzing the captured images, these intelligent algorithms output their individual decision based on its specific application. Compared with traditional cameras (especially RGB cameras), the DMS camera is capable of clearly capturing the in-cabin scene even in pitch-dark environment because driver fatigue is more likely to happen during night-time. A solution to achieving good low-light imaging quality is using a near-infrared (NIR) camera together with an infrared (IR) illuminator. The reason for using NIR camera is its invisibility to human eyes.

In one embodiment, the NIR light sensing unit 202 captures the ambient electromagnetic radiation reflected in the vehicle cabin. The NIR light sensing unit 202 is designed to receive the near-infrared (NIR) light with wavelength beyond 700 nm which is invisible to human eyes. In one embodiment, the NIR light sensing unit 202 is a focal plane array (FPA) NIR light sensing unit 202, which is an image sensing device consisting of an array (typically rectangular) of light-sensing pixels at the focal plane of a lens. The FPA NIR light sensing unit 202 operates by detecting photons at particular wavelengths and then generating an electrical charge, voltage, or resistance in relation to the number of photons detected by each pixel. This charge, voltage, or resistance is then measured, digitized, and used to construct an image of the object, scene, or phenomenon that emitted the photons. Again, the FPA NIR light sensing unit 202, in order to simultaneously serve the DMS functions, is typically accompanied with an infrared (IR) illuminator. In one embodiment, the IR illuminator is an IR LED illuminator 201.

Figure 3:
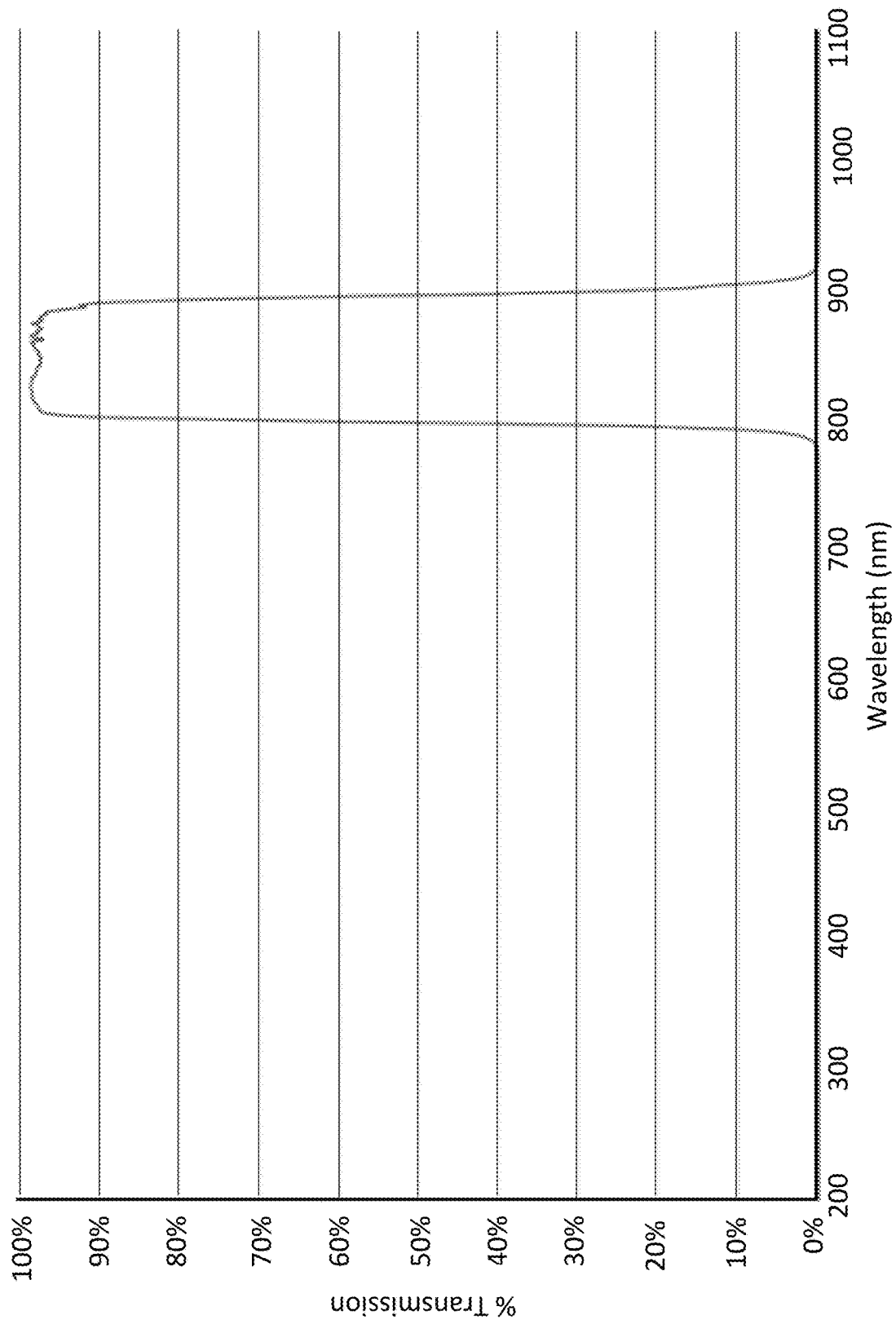
FIG. 3 shows schematically a typical wavelength response curve of the NIR light sensing unit.

FIG. 3 shows schematically a typical wavelength response curve of the NIR light sensing unit 202. In this example, the FPA NIR light sensing unit 202 is covered with color filter array whose passing band is between 825 nm to 875 nm, aligning with the wavelength range of the IR LED illuminator 201. Within the IR band, the FPA NIR light sensing unit 202 only captures a fraction of the entire spectrum (e.g., between 825 nm to 875 nm) of the sunlight or other illumination. However, this fraction of the spectrum can be used to reconstruct the brightness of visible light, assuming certain illumination.

The image data processing unit 206 analyzes the reflected IR light captured by the NIR light sensing unit 202. Typically, the image data processing unit 206 is integrated in an electronics control unit (ECU) of the vehicle. When the NIR light sensing unit 202 outputs an image to the image data processing unit, the image data processing unit 206 may potentially rely on one or several regions of interest (ROI) to determine the brightness of the ambient light. For example, the driver's face may be a ROI. Traditional ambient light sensors take an average over the entire field of view (FOV) to determine the brightness and output only one number at a time. Compared with traditional ambient light sensors which output only one number at a time, the image data processing unit 206 may rely on a large number of pixels for higher accuracy. Moreover, using several ROIs for the NIR light sensing unit 202 rather than a single point significantly improves the robustness of measurement. Using the NIR light sensing unit 202 provides the flexibility of choosing several representative ROIs to correctly reflect real illumination condition. The image data processing unit 206 generates a feedback after analyzing the reflected infrared light captured by the NIR light sensing unit 202.

The imaging control unit 204 receives the feedback. In response to the feedback, the imaging control unit 204 regulates the behavior of the NIR light sensing unit 202, so that the captured image can effectively cover the dynamic range of ambient light. The imaging control unit 204 can adjust the registers of the NIR light sensing unit 202 based on the feedback received from the image data processing unit 206. These registers directly control the properties of the NIR light sensing unit 202. Some examples of the properties of the NIR light sensing unit 202 includes exposure time, analog gain, digital gain and gamma.

In one embodiment of the present invention, the imaging control unit 204 is a piece of software or hardware integrated in the vehicle ECU which sends instructions to the NIR light sensing unit 202 so that the dynamic range of the ambient light can be fully covered by the NIR light sensing unit 202. The imaging control unit 204 is responsible for controlling the properties of the NIR light sensing unit 202 including, but not limited to, exposure time, analog gain, digital gain and gamma. Among all the properties, analog gain, digital gain and exposure time are directly related to the measurement of ambient light. Ignoring the gamma correction, the readout of the NIR light sensing unit 202 can be expressed by the following equation $$readout = L*T*A*D$$

where L, T, A, D represent ambient brightness, exposure time, analog gain and digital gain, respectively. Due to limited number of digits (14 bits or 12 bits) in the analog digital converter (ADC) of the NIR light sensing unit 202, any readout above the maximum threshold will cause saturation, which happens either at excessive analog gain A, digital gain D or exposure time T. On the other hand, insufficient analog gain A, digital gain D and exposure time T can cause not enough sensitivity to the ambient brightness L. To avoid both cases, the imaging control unit 204 adaptively changes the analog gain A, digital gain D and exposure time T, making sure that the ambient brightness L fall in a first range. In one embodiment, the first range is associated with the dynamic range of the NIR light sensing unit 202 under the current setting. In other words, the first range should be chosen so that it can nicely cover the dynamic range of the ambient light In one embodiment of the present invention, the image data processing unit 206 is a piece of software or hardware integrated in the ECU that analyzes the statistics of readouts generated from the NIR light sensing unit 202. The NIR light sensing unit 202 also needs to determine the ROIs that are effective for measuring the ambient brightness L. The ideal ROIs should be representative of ambient light condition, which means that the reflection properties of objects in the ROIs are well known. For example, the reflection properties of metal and plastics are well known. The readouts of the NIR light sensing unit 202 depend on both ambient illumination and reflection coefficients of objects in the ROIs. Thus, the image data processing unit 206 needs to rely on objects with known reflection coefficients to derive the ambient illumination. Consequently, the desired ROIs should be parts of objects with known reflection coefficients and those objects should not be blocked. In one embodiment of the present invention, the image data processing unit 206 may take an average over all the readouts associated with pixels in the ROIs. As the analog gain A, the digital gain D and the exposure time T are all directly related to measuring the illumination and can be accessed by the imaging control unit 204, the ambient brightness L can be calculated based on the above equation. The image data processing unit 206 eventually generates a calculated NIR intensity readout. It is important to note that taking an average over all pixels in the ROIs is only one possible way to get the calculated NIR intensity readout. Many other feasible approaches can be applied to generate the calculated NIR intensity readout.

The reconstruction unit 208 may correlate, from calibration, the calculated NIR intensity readout with human perceived brightness. FIG. 5 shows schematically a lookup table between calculated NIR intensity readout and human perceived brightness. For example, a calculated NIR intensity readout of 10 units is associated with a human perceived brightness of 20 units; a calculated NIR intensity readout of 20 units is associated with a human perceived brightness of 35 units; a calculated NIR intensity readout of 30 units is associated with a human perceived brightness of 66 units; and a calculated NIR intensity readout of 250 units is associated with a human perceived brightness of 700 units.

Figure 4:
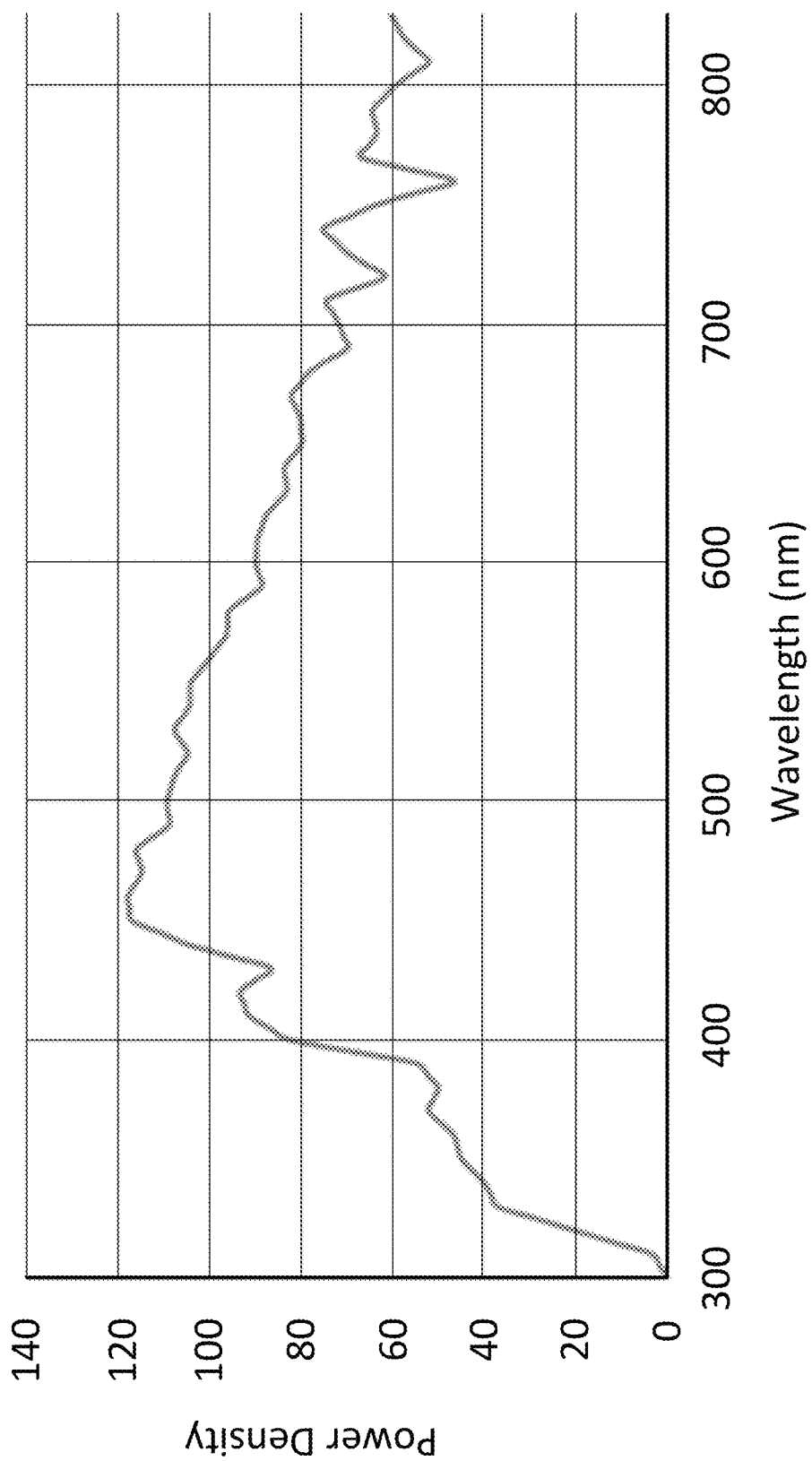
FIG. 4 shows schematically a power density function of a light source.

In one embodiment of the present invention, the reconstruction unit 208 reconstructs a human perceived brightness by correlating the calculated NIR intensity readout with human perceived brightness. The image data processing unit 206 may generate a calculated NIR intensity readout in NIR domain which is not desirable. The reconstruction unit 208 may use a lookup table like the one shown in FIG. 5 to correlate the calculated NIR intensity readout with the human perceived brightness. It should be noted that the quality of this lookup table is highly related to the ambient light source, because each ambient light source has its unique spectrum. Fortunately, for most of the time, the vehicle cabin is dominantly illuminated by either natural sunlight or the IR LED illuminator 201, whose spectrums are well studied. FIG. 4 shows schematically a power density function (i.e., a spectrum) of a CIE Standard Illuminant D65 light source which is a commonly used standard illuminant defined by the International Commission on Illumination (CIE). Therefore, the reconstruction unit can calibrate the lookup table accordingly, under both natural sunlight and the IR LED illumination 201, to reconstruct human perceived brightness based on the calculated NIR intensity readout.

In one embodiment of the present invention, the in-cabin display 210 in the vehicle receives output from the reconstruction unit 208 which indirectly gauges the ambient brightness, then adjusts its screen brightness accordingly. In one embodiment of the present invention, the in-cabin display 210 may have flexibility to adjust its own brightness and interface to external brightness measurement. Similarly, the reconstruction unit 208 may correlate, from calibration, the human perceived brightness with the target brightness of the in-cabin display 210 that is the most visually pleasant to the viewer of the in-cabin display 210. The reconstruction unit 208 may generate a lookup table correlating the human perceived brightness with the target brightness of the in-cabin display 210. The lookup table may be generated based on a set of prior psychophysical experiences. For example, each viewer is asked to choose the most pleasant level of brightness of the in-cabin display 210 under various levels of ambient brightness. Then the reconstruction unit 208 may generate the lookup table customized for that viewer.

In one embodiment of the present invention, the in-cabin display 210 may optimize the brightness change rate for better user experience. After finding the target brightness of the in-cabin display 210, the in-cabin display 210 needs to gradually adjust its brightness to the target brightness of the in-cabin display 210. An abrupt change of brightness (i.e., high brightness change rate) may cause unpleasant visual experience and potential flickering to the viewer. On the other hand, low brightness change rate may cause issue of insensitivity. Thus, the in-cabin display 210 is optimized to have an optimal brightness change rate based on experience. Alternatively, the in-cabin display 210 has a brightness change rate within a second range, and the second range should be chosen so that drivers will experience smooth transition when brightness of the in-cabin display changes. In one embodiment, this brightness change rate is a variable of the current brightness and it can be stored in a lookup table.

Figure 6:
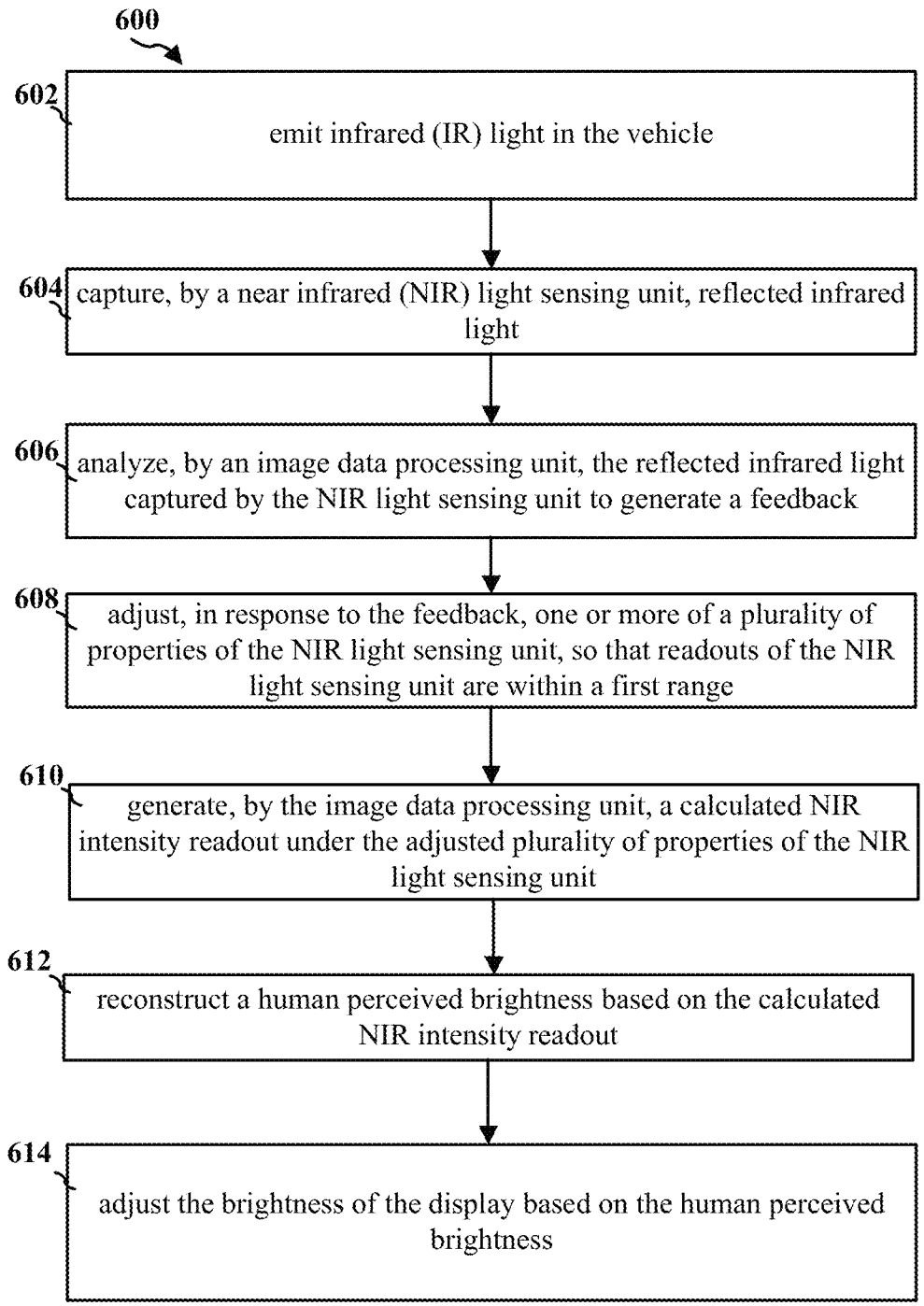
FIG. 6 shows schematically a flow chart of a method for brightness control of vehicle display based on infrared camera according to one embodiment of the invention.

In another aspect of the invention, the method for controlling a brightness of a display of a vehicle, as shown in FIG. 6, includes the following steps. The method may be implemented by a system 200 for brightness control of vehicle display described above. It should be noted that the method may be implemented by other apparatus. It should be noted that all or a part of the steps according to the embodiments of the invention may be implemented by hardware or a program instructing relevant hardware.

At step 602, the IR LED illuminator 201 emits infrared (IR) light in the vehicle.

At step 604, the near infrared (NIR) light sensing unit 202 captures reflected infrared light. In one embodiment, the NIR light sensing unit 202 is a unit of a driver monitoring system (DMS). In one embodiment, the NIR light sensing unit 202 is a focal plane array (FPA) NIR light sensing unit. In one embodiment, the NIR light sensing unit 202 is covered with a color filter, the color filter having a passing band between 825 nm and 875 nm.

At step 606, the image data processing unit 206 analyzes the reflected infrared light captured by the NIR light sensing unit to generate a feedback.

At step 608, the imaging control unit 204, in response to the feedback, adjusts one or more of a plurality of properties of the NIR light sensing unit, so that readouts of the NIR light sensing unit are within a first range. In one embodiment, the plurality of properties of the NIR light sensing unit are one or more of: an analog gain; a digital gain; and an exposure time. In one embodiment, the first range is associated with a dynamic range of the NIR light sensing unit.

At step 610, the image data processing unit 206 generates a calculated NIR intensity readout under the adjusted plurality of properties of the NIR light sensing unit. In one embodiment, the image data processing unit 206 takes an average over one or more regions of interest (ROI) in the vehicle to calculate the calculated NIR intensity readout.

At step 612, the reconstruction unit 208 reconstructs a human perceived brightness based on the calculated NIR intensity readout. In one embodiment, the reconstruction unit 208 correlates the calculated NIR intensity readout with the human perceived brightness based on a first set of prior psychophysical experiments.

At step 614, the in-cabin display 210 adjusts the brightness of the in-cabin display 210 based on the human perceived brightness. In one embodiment, the in-cabin display 210 correlates the human perceived brightness with the brightness of the display based on a second set of prior psychophysical experiments. In one embodiment, the in-cabin display 210 has a brightness change rate within a second range.

Yet another aspect of the invention provides a non-transitory tangible computer-readable medium storing instructions which, when executed by one or more processors, cause the above disclosed method for controlling a brightness of a display of a vehicle to be performed. The computer executable instructions or program codes enable the above disclosed apparatus or a similar system to complete various operations in accordance with the above disclosed method. The storage medium/memory may include, but is not limited to, high-speed random access medium/memory such as DRAM, SRAM, DDR RAM or other random access solid state memory devices, and non-volatile memory such as one or more magnetic disk storage devices, optical disk storage devices, flash memory devices, or other non-volatile solid state storage devices.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

What is claimed is:

1. An apparatus for controlling a brightness of a display of a vehicle, comprising:
   an infrared (IR) illuminator, configured to emit infrared light in the vehicle;
   a near infrared (NIR) light sensing unit, configured to capture reflected infrared light;
   an image data processing unit, configured to analyze the reflected infrared light captured by the NIR light sensing unit to generate a feedback;
   an imaging control unit, configured to adjust, in response to the feedback, one or more properties of the NIR light sensing unit, so that readouts of the NIR light sensing unit are within a first range, wherein the image data processing unit generates a calculated NIR intensity readout under the adjusted one or more properties of the NIR light sensing unit;
   a reconstruction unit, configured to reconstruct a human perceived brightness based on the calculated NIR intensity readout; and
   the display, configured to adjust the brightness based on the human perceived brightness.

2. The apparatus of claim 1, wherein the NIR light sensing unit is a unit of a driver monitoring system (DMS).

3. The apparatus of claim 1, wherein the NIR light sensing unit is a focal plane array (FPA) NIR light sensing unit.

4. The apparatus of claim 1, wherein the NIR light sensing unit is covered with a color filter, the color filter having a passing band between 825 nm and 875 nm.

5. The apparatus of claim 1, wherein the one or more properties of the NIR light sensing unit are one or more of:
an analog gain;
a digital gain; and
an exposure time.

6. The apparatus of claim 1, wherein the first range is associated with a dynamic range of the NIR light sensing unit.

7. The apparatus of claim 1, wherein the image data processing unit takes an average over all the readouts of the NIR light sensing unit associated with pixels in one or more regions of interest (ROI) in the vehicle to calculate the calculated NIR intensity readout.

8. The apparatus of claim 1, wherein the reconstruction unit correlates the calculated NIR intensity readout with the human perceived brightness based on a first set of prior psychophysical experiments.

9. The apparatus of claim 1, wherein the display correlates the human perceived brightness with the brightness of the display based on a second set of prior psychophysical experiments.

10. The apparatus of claim 1, wherein the display has a brightness change rate within a second range.

11. A method for controlling a brightness of a display of a vehicle, comprising:
emitting infrared (IR) light in the vehicle;
capturing, by a near infrared (NIR) light sensing unit, reflected infrared light;
analyzing, by an image data processing unit, the reflected infrared light captured by the NIR light sensing unit to generate a feedback;
adjusting, in response to the feedback, one or more properties of the NIR light sensing unit, so that readouts of the NIR light sensing unit are within a first range;
generating, by the image data processing unit, a calculated NIR intensity readout under the adjusted one or more properties of the NIR light sensing unit;
reconstructing a human perceived brightness based on the calculated NIR intensity readout; and
adjusting the brightness of the display based on the human perceived brightness.

12. The method of claim 11, wherein the NIR light sensing unit is a unit of a driver monitoring system (DMS).

13. The method of claim 11, wherein the NIR light sensing unit is a focal plane array (FPA) NIR light sensing unit.

14. The method of claim 11, wherein the NIR light sensing unit is covered with a color filter, the color filter having a passing band between 825 nm and 875 nm.

15. The method of claim 11, wherein the one or more properties of the NIR light sensing unit are one or more of:
an analog gain;
a digital gain; and
an exposure time.

16. The method of claim 11, wherein the first range is associated with a dynamic range of the NIR light sensing unit.

17. The method of claim 11, further comprising:
taking an average, by the image data processing unit, over all the readouts of the NIR light sensing unit associated with pixels in one or more regions of interest (ROI) in the vehicle to calculate the calculated NIR intensity readout.

18. The method of claim 11, further comprising:
correlating the calculated NIR intensity readout with the human perceived brightness based on a first set of prior psychophysical experiments.

19. The method of claim 11, further comprising:
correlating the human perceived brightness with the brightness of the display based on a second set of prior psychophysical experiments.

20. The method of claim 11, wherein the display has a brightness change rate within a second range.

21. A non-transitory tangible computer-readable medium storing instructions which, when executed by one or more processors, cause a method for controlling a brightness of a display of a vehicle to be performed, the method comprising:
emitting infrared (IR) light in the vehicle;
capturing, by a near infrared (NIR) light sensing unit, reflected infrared light;
analyzing, by an image data processing unit, the reflected infrared light captured by the NIR light sensing unit to generate a feedback;
adjusting, in response to the feedback, one or more properties of the NIR light sensing unit, so that readouts of the NIR light sensing unit are within a first range;
generating, by the image data processing unit, a calculated NIR intensity readout under the adjusted one or more properties of the NIR light sensing unit;
reconstructing a human perceived brightness based on the calculated NIR intensity readout; and
adjusting the brightness of the display based on the human perceived brightness.

22. The non-transitory tangible computer-readable medium of claim 21, wherein the NIR light sensing unit is a unit of a driver monitoring system (DMS).

* * * * *